United States Patent
Abdelrahman et al.

(10) Patent No.: US 9,660,593 B2
(45) Date of Patent: May 23, 2017

(54) WEIGHTED MEMORY POLYNOMIAL METHOD AND SYSTEM FOR POWER AMPLIFIERS PREDISTORTION

(71) Applicant: KING FAHD UNIVERSITY OF PETROLEUM AND MINERALS, Dhahran (SA)

(72) Inventors: Abdalla Ebrahim Abdelrahman, Al-Khobar (SA); Oualid Hammi, Dhahran (SA); Azzedine Zerguine, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 15/281,900

(22) Filed: Sep. 30, 2016

(65) Prior Publication Data
US 2017/0047899 A1     Feb. 16, 2017

Related U.S. Application Data

(63) Continuation of application No. 14/533,486, filed on Nov. 5, 2014, now Pat. No. 9,461,597.

(51) Int. Cl.
| | |
|---|---|
| *H03F 1/26* | (2006.01) |
| *H03F 1/32* | (2006.01) |
| *H03F 1/02* | (2006.01) |
| *H03F 3/21* | (2006.01) |
| *H03F 3/24* | (2006.01) |
| *H04B 1/04* | (2006.01) |
| *H03F 3/19* | (2006.01) |

(52) U.S. Cl.
CPC ......... *H03F 1/3247* (2013.01); *H03F 1/0205* (2013.01); *H03F 1/3258* (2013.01); *H03F 3/19* (2013.01); *H03F 3/21* (2013.01); *H03F 3/245* (2013.01); *H04B 1/0475* (2013.01); *H03F 2200/451* (2013.01); *H03F 2201/3224* (2013.01); *H03F 2201/3231* (2013.01); *H04B 2001/0425* (2013.01)

(58) Field of Classification Search
None
See application file for complete search history.

(56) References Cited

U.S. PATENT DOCUMENTS

| | | | | |
|---|---|---|---|---|
| 5,867,065 | A * | 2/1999 | Leyendecker | ........ H03F 1/3247 330/149 |
| 8,611,459 | B2 * | 12/2013 | McCallister | ...... H04L 25/03343 330/149 |
| 9,172,409 | B2 * | 10/2015 | Copeland | ............. H04B 1/0475 |

(Continued)

FOREIGN PATENT DOCUMENTS

KR     10-2012-0053134 A     5/2012

*Primary Examiner* — Patricia T Nguyen
(74) *Attorney, Agent, or Firm* — Oblon, McClelland, Maier & Neustadt, L.L.P.

(57) ABSTRACT

A system and method for linearizing a power amplifier using digital predistortion technique is provided including processing circuitry, the processing circuitry configured to apply a digital predistortion function based on a weighted static polynomial function, a weighted dynamic polynomial function and a threshold parameter which splits the nonlinear transfer characteristics of the device under test into a region where the static nonlinearity predominates and a region where the dynamic distortions predominate.

6 Claims, 9 Drawing Sheets

(56) References Cited

U.S. PATENT DOCUMENTS

| | | |
|---|---|---|
| 2005/0009479 A1* | 1/2005 | Braithwaite .......... H03F 1/3235 455/114.3 |
| 2005/0116775 A1* | 6/2005 | McBeath .............. H03F 1/3241 330/149 |
| 2005/0195919 A1 | 9/2005 | Cova |
| 2007/0190952 A1 | 8/2007 | Waheed |
| 2009/0004981 A1 | 1/2009 | Eliezer |
| 2013/0329833 A1 | 12/2013 | Bai |
| 2014/0333376 A1 | 11/2014 | Hammi |
| 2015/0162881 A1 | 6/2015 | Hammi |
| 2016/0126903 A1* | 5/2016 | Abdelrahman ...... H04B 1/0475 330/149 |

* cited by examiner

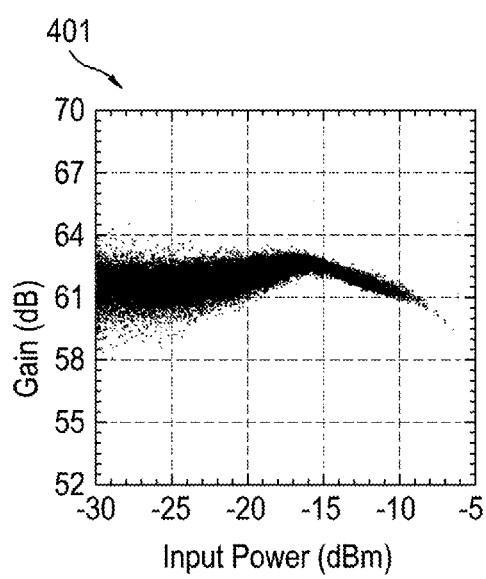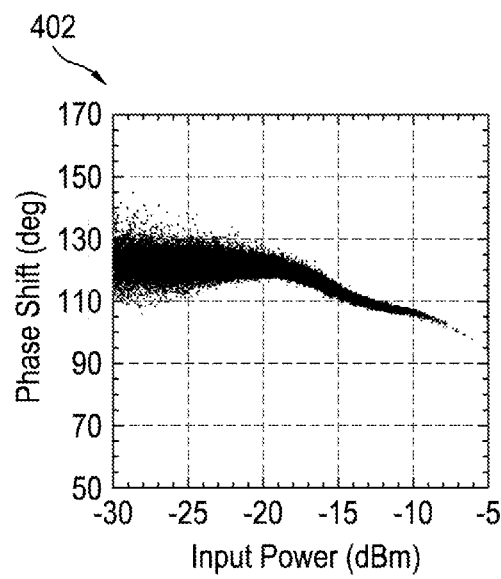
FIG. 4A
FIG. 4B
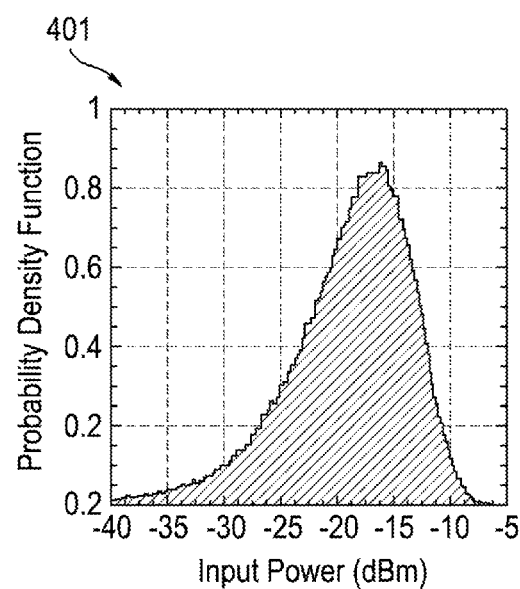
FIG. 4C

WEIGHTED MEMORY POLYNOMIAL METHOD AND SYSTEM FOR POWER AMPLIFIERS PREDISTORTION

CROSS-REFERENCE TO RELATED APPLICATIONS

This application is a continuation of Ser. No. 14/533,486, allowed.

BACKGROUND

Field of the Invention

The exemplary embodiments described herein relate to power amplifier linearization through digital predistortion, and a method for linearizing power amplifiers having memory effects.

Background of the Invention

Power amplifiers (PAs) are the main cause of nonlinearities in transmitters used in communication systems. These nonlinearities appear as a result of using spectrum efficient modulating techniques which lead to amplitude modulated time domain signals with high peak-to-average power ratios (PAPR). The signal's amplitude modulation emulates the static nonlinear behaviour of PAs. Moreover, electrical memory effects will be induced due to the wide bandwidth of these signals. In order to meet the spectrum emission requirements of modern communication standards, digital predistortion is needed to compensate for the nonlinearity of power amplifiers. As a result, an accurate predistorter that compensates for both dynamic and static behaviours of PAs is needed for communication and broadcasting applications.

Static nonlinear behaviour appears as a deviation of the gain from its constant value as the instantaneous input power approaches the saturation region in the AM/AM and AM/PM characteristics of the PA, while dynamic behaviour appears as dispersion in these same characteristics (F. M. Ghannouchi and O. Hammi, "Behavioral modeling and predistortion," *IEEE Microw. Mag.*, vol. 10, no. 7, pp. 52-64, December 2009—incorporated herein by reference). For power amplifiers exhibiting memory effects, many behavioural models and digital predistortion functions have been proposed (F. M. Ghannouchi and O. Hammi, "Behavioral modeling and predistortion," *IEEE Microw. Mag.*, vol. 10, no. 7, pp. 52-64, December 2009—incorporated herein by reference), (Y. J. Liu, J. Zhou, W. Chen, B. Zhou, and F. M. Ghannouchi, "Low-complexity 2D behavioural model for concurrent dual-band power amplifiers," *Electronics Letters*, vol. 48, no. 11, pp. 620-621, May 2012-incorporated herein by reference), (J. Kim and K. Konstantinou, "Digital predistortion of wideband signals based on power amplifier model with memory," *Electronics Lett.*, vol. 37, no. 23, pp. 1417-1418, November 2001—incorporated herein by reference), (D. R. Morgan, Z. Ma, J. Kim, M. G. Zierdt, and J. Pastalan, "A Generalized Memory Polynomial Model for Digital Predistortion of RF Power Amplifiers," *IEEE Trans. Signal Process.*, vol. 54, no. 10, pp. 3852-3860, October 2006—incorporated herein by reference), (R. Raich, H. Qian, and G. T. Zhou, "Orthogonal polynomials for power amplifier modeling and predistorter design," *IEEE Trans. Veh. Technol.*, vol. 53, no. 5, pp. 1468-1479, September 2004—incorporated herein by reference), and (O. Hammi, F. M. Ghannouchi, and B. Vassilakis, "A compact envelope-memory polynomial for RF transmitters modeling with application to baseband and RF-digital predistortion," *IEEE Microw. Wireless Compon. Lett.*, vol. 18, no. 5, May. 2008, pp. 359-361—incorporated herein by reference). Due to its ease of use and acceptable performance, the memory polynomial (MP) model (see J. Kim and K. Konstantinou, "Digital predistortion of wideband signals based on power amplifier model with memory," *Electronics Lett.*, vol. 37, no. 23, pp. 1417-1418, November 2001—incorporated herein by reference) has been an appealing one. Later several of its variants were reported in the literature (D. R. Morgan, Z. Ma, J. Kim, M. G. Zierdt, and J. Pastalan, "A Generalized Memory Polynomial Model for Digital Predistortion of RF Power Amplifiers," *IEEE Trans. Signal Process.*, vol. 54, no. 10, pp. 3852-3860, October 2006.—incorporated herein by reference), (R. Raich, H. Qian, and G. T. Zhou, "Orthogonal polynomials for power amplifier modeling and predistorter design," *IEEE Trans. Veh. Technol.*, vol. 53, no. 5, pp. 1468-1479, September 2004—incorporated herein by reference), and (O. Hammi, F. M. Ghannouchi, and B. Vassilakis, "A compact envelope-memory polynomial for RF transmitters modeling with application to baseband and RF-digital predistortion," *IEEE Microw. Wireless Compon. Lett.*, vol. 18, no. 5, May. 2008, pp. 359-361.—incorporated herein by reference).

SUMMARY

In one embodiment, there is provided a system for predistorting a baseband input signal of a power amplifier, including: digital signal processing circuitry, a frequency upconversion module, and a feedback module, the digital signal processing circuitry configured to: obtain an input signal sample, determine a static term coefficients and a dynamic term coefficients; determine a static weight function and a dynamic weight function; predistort an input signal sample using a static weighted polynomial function to generate a first intermediate predistorted signal sample; and predistort the same input signal sample using a weighted dynamic polynomial function to generate a second intermediate predistorted signal sample; and additively combine the first intermediate predistorted signal sample and the second intermediate predistorted signal sample together to obtain an output signal sample of the predistorter.

In another embodiment, the digital signal processing circuitry is further configured to determine the baseband complex sample of the predistorted signal using:

$$y_{WMP}(n) = y_{SWMP}(n) + y_{DWMP}(n)$$

wherein $y_{WMP}(n)$ is the output baseband complex sample of the predistorter, and $y_{SWMP}(n)$ and $y_{DWMP}(n)$ are the first and second intermediate predistorted baseband complex samples, respectively.

The first intermediate predistorted baseband complex sample $y_{SWMP}(n)$ is obtained at the output of the weighted static polynomial function using $$y_{SWMP}(n) = \sum_{i=0}^{N_S} \alpha_i w_s(|x(n)|, i) x(n) |x(n)|^i$$

wherein $x(n)$ is the input baseband complex sample of the predistorter; $\alpha_i$ and $N_S$ are the coefficients and the nonlinearity order of the weighted static polynomial function, respectively; and $w_s(|x(n)|, i)$ is the weighting function of the static polynomial.

The second intermediate predistorted baseband complex sample $y_{DWMP}(n)$ is obtained at the output of the weighted dynamic polynomial function using $$y_{SWMP}(n) = \sum_{i=0}^{N_D} \sum_{j=1}^{M} \beta_{ij} w_D(|x(n)|, i, j) x(n-j) |x(n-j)|^i$$

wherein x(n) is the input baseband complex sample of the predistorter; $\beta_{ij}$, $N_S$ and M are the coefficients, the nonlinearity order, and the memory depth of the weighted dynamic polynomial function, respectively; and $w_D(|x(n)|,i,j)$ is the weighting function of the dynamic polynomial.

In another embodiment, the predistorter's circuitry further configured to determine the static weight function using:

$$w_s(|x(n)|, i) = \frac{1}{2}\left(\tanh\left(-i \cdot \left(1 - \frac{|x(n)|}{|x|_{th}}\right)\right) + 1\right)$$

wherein tan h is the hyperbolic tangent function, x(n) is the predistorter's input baseband complex samples and $|x_{th}|$ is the threshold magnitude that is used to delimit the region where a static nonlinearity predominates from that where the memory effects prevail.

In another embodiment, the predistorter's circuitry is further configured to determine the dynamic weight function using:

$$w_D(|x(n)|, i, j) = \frac{1}{2}\left(\tanh\left(\frac{1}{j^2 \cdot i} \cdot \left(1 - \frac{|x(n)|}{|x|_{th}}\right)\right) + 1\right)$$

wherein tan h is a hyperbolic tangent function, x(n) is the predistorter's input baseband complex samples and $|x_{th}|$ is the threshold magnitude that is used to delimit the region where a static nonlinearity predominates from that where the memory effects prevail.

In another embodiment, the threshold parameter $|x_{th}|$ splits the nonlinear transfer characteristics of the device under test into a region where a static nonlinearity predominates and a region where the dynamic distortions predominate.

In a second aspect the present disclosure includes a method for predistorting a baseband input signal, including: obtaining, with processing circuitry, complex baseband input signal samples and complex baseband output signal samples of the amplifier; determining, with processing circuitry, a static weight function and a dynamic weight function; determining, with processing circuitry, coefficients of a weighted static polynomial and coefficients of a weighted dynamic polynomial; applying, with processing circuitry, the weighted static polynomial function to the input signal sample to obtain a static term output signal sample; applying, with processing circuitry, the weighted dynamic polynomial function to the input signal sample and to the M preceding input signal samples to obtain a dynamic term output signal sample; and combining, with processing circuitry, the static term output signal and the dynamic term output signal together to obtain a predistorted output signal sample.

BRIEF DESCRIPTION OF THE DRAWINGS

The characteristics and advantages of an exemplary embodiment are set out in more detail in the following description, made with reference to the accompanying drawings.

FIG. 4 shows exemplary AM/AM and AM/PM characteristics of a power amplifier, and exemplary probability density function of a communication signal;

DETAILED DESCRIPTION OF THE EMBODIMENTS

Figure 1:
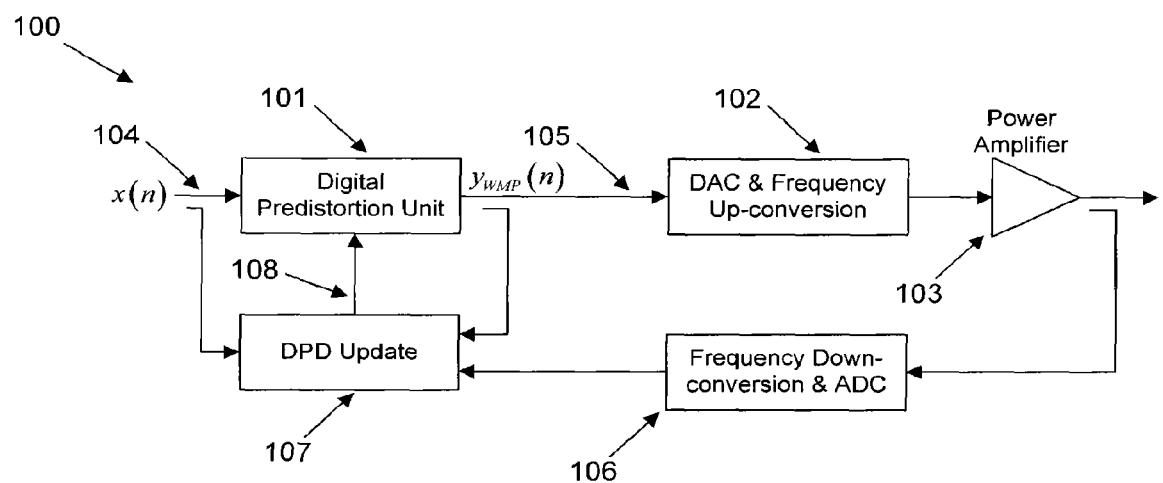
FIG. 1 illustrates a simplified block diagram of a wireless transmitter in which a digital predistorter is used to linearize the RF power amplifier.

A novel digital predistortion model, method and system of compensating amplifier's dynamic nonlinear distortions that uses an adaptive weight for dynamic and static terms of the conventional MP models, methods and/or systems is disclosed. The disclosed model, method and system find rationale in the dispersion profile of power amplifiers' AM/AM (amplitude distortion) and AM/PM (phase distortion) characteristics which reveal a mildly nonlinear behaviour with strong memory effects at low input power levels and a highly nonlinear behavior with weak memory effects at high input power levels. A 10-Watt Doherty power amplifier excited by a 20 MHz long term evolution (LTE) signal was used for experimental validation. The performance of the new model, method and system is benchmarked against that of the conventional MP model.

The conventional memory polynomial model expresses the baseband complex waveform at the output of the digital predistorter as a power series with memory of the baseband input complex samples. This model represents the diagonal elements of the Volterra series regression matrix (J. Kim and K. Konstantinou, "Digital predistortion of wideband signals based on power amplifier model with memory," *Electronics Lett.*, vol. 37, no. 23, pp. 1417-1418, November 2001— incorporated herein by reference)

$$y_{MP}(n) = \sum_{i=0}^{N} \sum_{j=0}^{M} a_{ij} x(n-j) |x(n-j)|^i \quad (1)$$

where $y_{MP}(n)$ is the complex baseband output sample and x(n) its input counterpart. M, N, and $a_{ij}$ are the memory depth, the nonlinearity order, and the coefficients of the predistorter, respectively.

The disclosed model, method and system split the memory polynomial model into a static part and a dynamic part and introduces a weight function on the MP model coefficients that will distinguishably act on the input samples based on their power levels. Accordingly, the proposed WMP model, method and system are formulated as:

$$y_{WMP}(n) = \sum_{i=0}^{N_S} \alpha_i w_s(|x(n)|, i) x(n) |x(n)|^i + \sum_{i=0}^{N_D} \sum_{j=1}^{M} \beta_{ij} w_D(|x(n)|, i, j) x(n-j) |x(n-j)|^i \quad (2)$$

where $y_{WMP}(n)$ and $x(n)$ are the output and input baseband complex samples, respectively, $\alpha_i$ and $\beta_{ij}$ are the coefficients of the static and dynamic terms of the weighted memory polynomial model, respectively, M is the memory depth of the model, $N_S$ and $N_D$ refer to the nonlinearity order of the static and dynamic parts of the WMP model, respectively, and $w_S(|x(n)|,i)$ and $w_D(|x(n)|,i,j)$ are the weight functions applied on the static and dynamic terms of the WMP model, respectively.

For samples having low input power levels, which will fall within the linear region of the PA, the static terms weight function $w_S(|x(n)|,i)$ is applied to decrease the contribution of high order static nonlinear terms, and the dynamic terms weight function $w_D(|x(n)|,i,j)$ is applied to increase the impact of the dynamic terms. Conversely, as the input power level increases, $w_S(|x(n)|,i)$ will confer an increasing influence to high order static nonlinear terms, and $w_D(|x(n)|,i,j)$ will decrease the impact of the dynamic terms.

The static weight function is a hyperbolic tangent function applied to the static function terms of the memory polynomial model. The hyperbolic static weight function gives an increasing weight to the nonlinear static terms as the instantaneous input power increases, and its value is proportional to the nonlinearity order. The static weight function is defined as:

$$w_s(|x(n)|, i) = \frac{1}{2}\left(\tanh\left(-F(i) \cdot \left(1 - \frac{|x(n)|}{|x|_{th}}\right)\right) + 1\right) \quad (3)$$

where $|x|_{th}$ is a device dependent threshold value used to separate between the region where the static nonlinearity predominates from that where the dynamic distortions predominate. The function F(i) is proportional to the nonlinearity order (i). One alternative is to define the function F(i) according to:

$$F(i)=i \quad (4)$$

The dynamic weight function is a hyperbolic tangent function applied to the dynamic terms of the conventional memory polynomial model. Dynamic terms are given a decreasing weight as the instantaneous input power increases. The value of the dynamic weight function is inversely proportional to memory depth and nonlinearity order. The dynamic weight function is given by:

$$w_D(|x(n)|, i, j) = \frac{1}{2}\left(\tanh\left(G(i, j) \cdot \left(1 - \frac{|x(n)|}{|x|_{th}}\right)\right) + 1\right) \quad (5)$$

The function G(i,j) takes into account the decaying memory effects intensity for further memory indices and the fact that memory effects are mainly linear. On possible formulation of the function G(i,j) is:

$$G(i, j) = \frac{1}{j^2 \cdot i} \quad (6)$$

The threshold parameter splits the nonlinear transfer characteristics of the device under test into a region where the static nonlinearity predominates and a region where the dynamic distortions predominate. The static nonlinearity predominates for input power levels beyond the threshold value, and the dynamic distortions predominate for power levels below the threshold value.

Referring to FIG. 1, a block diagram 100 describing the proposed method for linearizing the power amplifier 103 through predistortion of the input signal 104 is shown. The digital predistortion unit 101 acts on the baseband digital input signal 104 to obtain the predistorted baseband digital signal 105. This predistorted digital signal is converted to analog and then up-converted by the digital to analog conversion & frequency up-conversion module 102 to obtain the RF signal that will be applied to the power amplifier 103.

A copy of signal at the output of the power amplifier 103 is down-converted and digitized using the module 106 to obtain the corresponding baseband complex signal. This signal, the predistorter's input signal 104, and the predistorter's output signal 105 are applied to the DPD update module 107 to calculate the DPD coefficients 108 ($\alpha_i$ and $\beta_{ij}$) that will be used in the digital predistortion unit 101.

Figure 2:
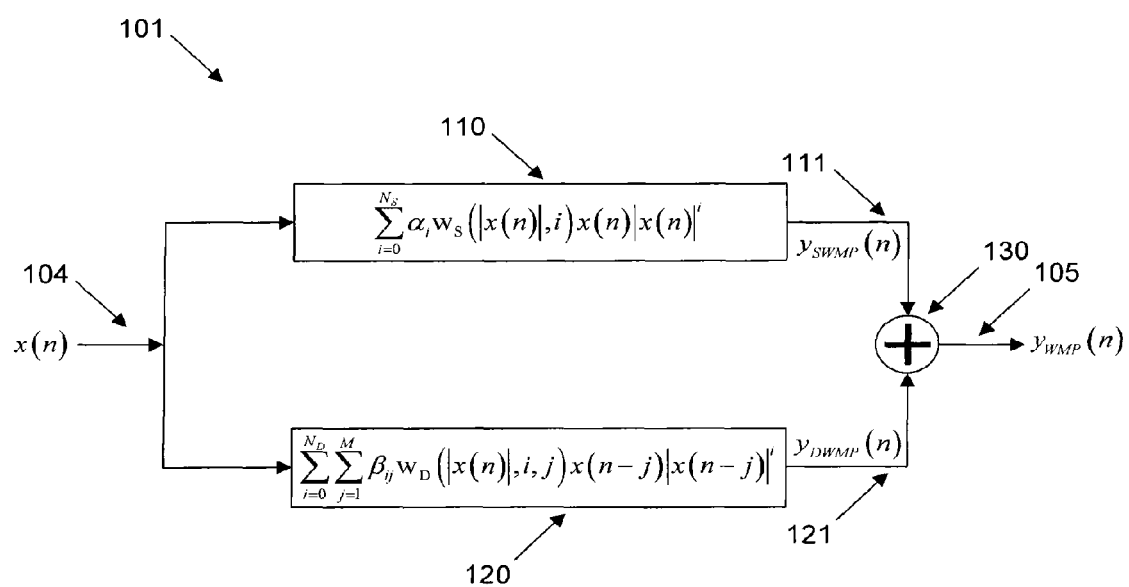
FIG. 2 shows a schematic diagram of the disclosed digital predistorter including the weighted static polynomial function and the weighted dynamic polynomial function.

The digital predistortion unit 101 implementing the disclosed weighted memory polynomial function is detailed in FIG. 2. The input signal 104 is applied at the input of the weighted static polynomial function 110 to obtain the first intermediate predistorted signal ($y_{SWMP}$) 111. The input signal 104 is also applied at the input of the weighted dynamic memory polynomial function 120 to obtain the second intermediate predistorted signal ($y_{DWMP}$) 121. The intermediate predistorted signals 111 and 121 are summed in 130 to obtain the predistorter output signal 105.

Figure 3A:
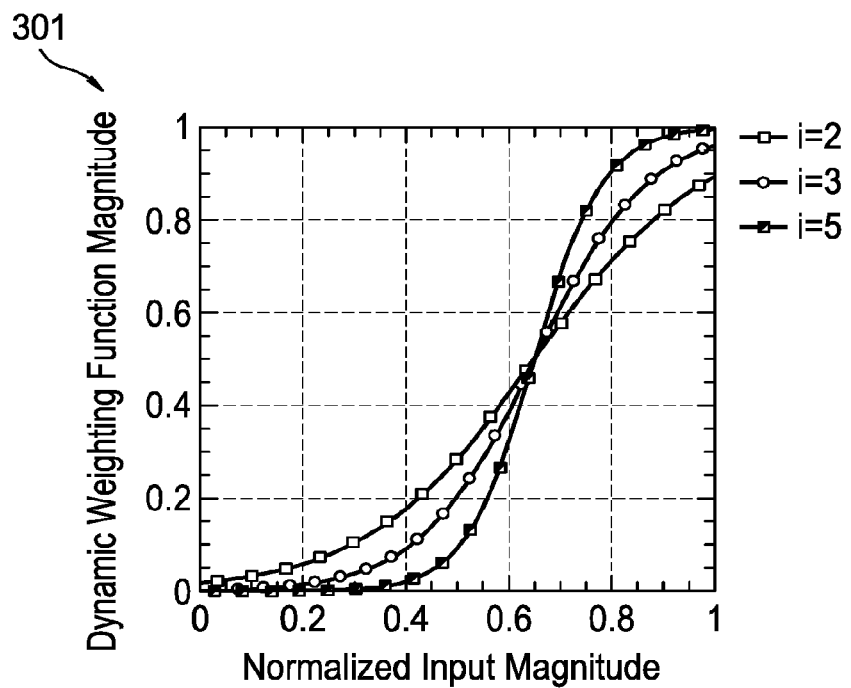
FIG. 3 shows exemplary magnitudes of the weighting functions applied to the static and dynamic polynomials.
Figure 3B:
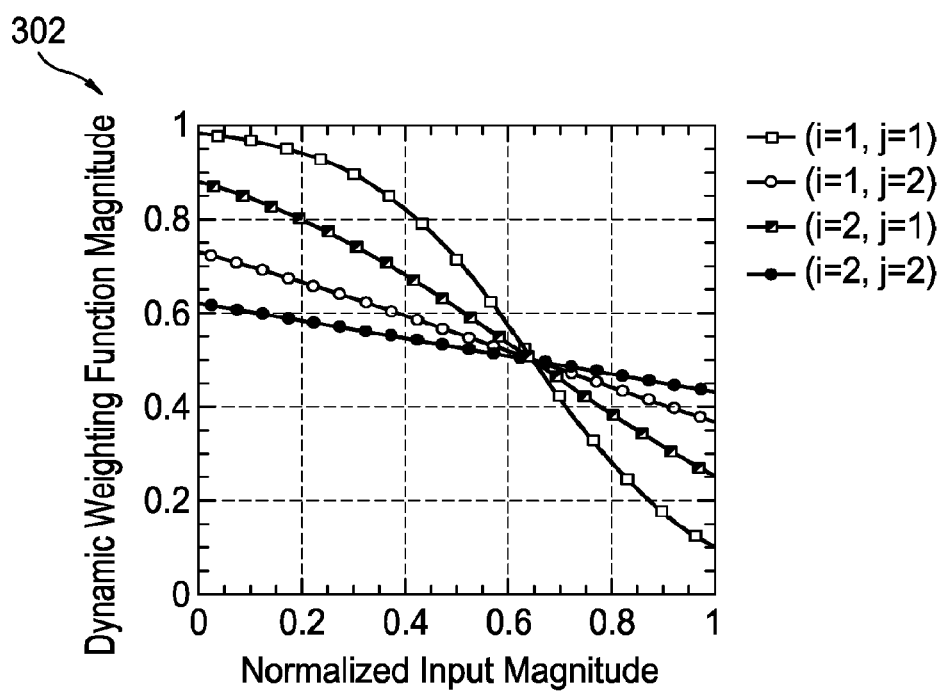

In FIG. 3, the plot of the magnitude of the static weight function is shown in 301 and the plot of the magnitude of the dynamic weight function is shown in 302. In 301 and 302, the magnitudes of the weight functions are reported as a function of the input magnitude normalized with respect to the maximum input magnitude ($|x|_{max}$). This figure, obtained for $|x_{th}|=0.65|x|_{max}$, clearly illustrates the effects of the weight functions as described above. Indeed, the magnitude of the static terms' weight function $w_s$ increases with the magnitude of the input signal as well as the nonlinearity order i. Conversely, for given values of i and j, the magnitude of the dynamic terms' weight function $w_D$ decreases when the amplifier is driven into its nonlinear region. Furthermore, at constant input power, and for given memory depth j, dynamic weight functions corresponding to low nonlinearity order have a more significant impact since memory effects are mainly linear. Moreover, at constant input power, and for given nonlinearity order i, dynamic weight functions have a decaying magnitude with respect to the memory depth. It is worth mentioning that the shape of these functions can be controlled by the choice of $|x_{th}|$ as well as the dependency of the weight functions on i and j. Typically, the values of $|x_{th}|$ is chosen in the vicinity of the 1 dB compression point of the device under test.

For the experimental validation, a 10-Watt gallium nitride (GaN) Doherty power amplifier driven by a 4-carrier LTE signal with 1001 carrier configuration and a total bandwidth of 20 MHz was used. The power amplifier was characterized by measuring its instantaneous input and output baseband complex waveforms as described in (F. M. Ghannouchi and O. Hammi, "Behavioral modeling and predistortion," *IEEE Microw. Mag.*, vol. 10, no. 7, pp. 52-64, December 2009—incorporated herein by reference). The measured waveforms were then processed to cancel the propagation delay. The AM/AM and AM/PM characteristics of the amplifier as well as the probability density function of the test signal are shown in FIG. 4. In the AM/AM characteristic 401 and the AM/PM characteristic 402 significant dispersion is observed at low power levels. The probability density function of the test signal is reported in 403. This figure shows that the large dispersion in the characteristics 401 and 402 is observed for power levels with low probability density function. This dispersion can thus be associated with the memory effects of the DUT and not the presence of high number of samples.

Figure 5:
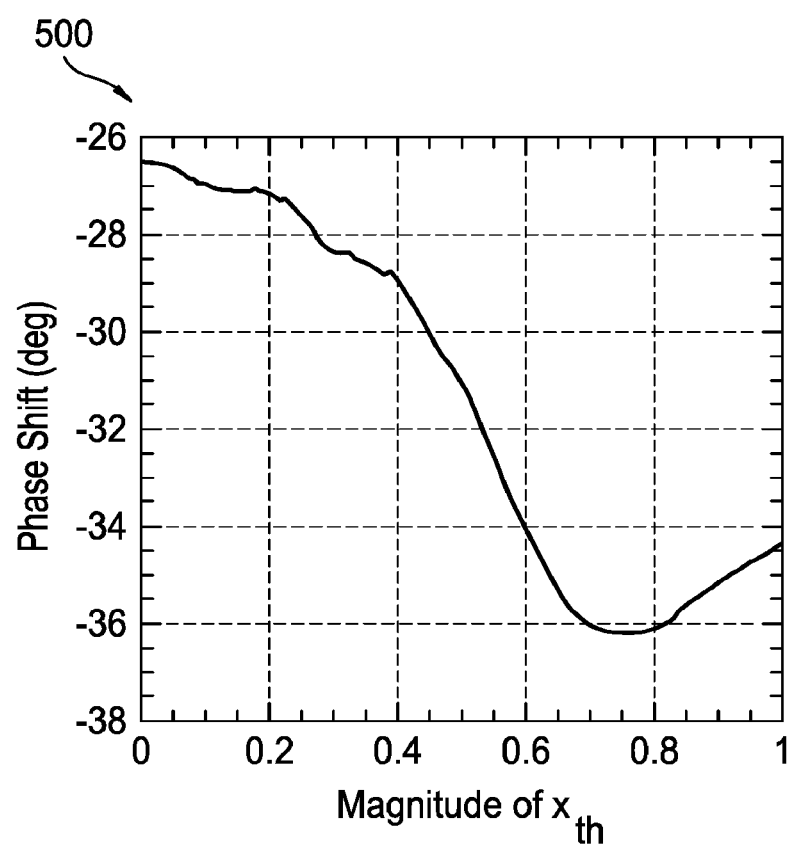
FIG. 5 shows exemplary performance of the weighted memory polynomial digital predistortion system as a function of a threshold value.

The effects of the threshold parameter $|x_{th}|$ are investigated in FIG. 5. The plot 500 reports the performance of the weighted memory polynomial function in predicting the desired output signal as a function of the value of $|x_{th}|$. This figure shows that there is an optimal value for which the performance are best. This value depends on the power amplifier nonlinearity profile and the drive signal.

First, the MP based digital predistorter was derived for various nonlinearity orders and memory depths. Then, the proposed WMP based digital predistorter was derived for the same set of nonlinearity orders and memory depths. Even though, the proposed WMP predistorter allows for separately selecting the nonlinearity order of the static and dynamic polynomial functions, $N_S$ and $N_D$ were equal during the test. This is to ensure fair comparison with the MP predistorter for which the same nonlinearity order is typically used for all branches. Though, it should be noted that separate optimization of these two orders is an additional feature and advantage of the proposed model.

Figure 6A:
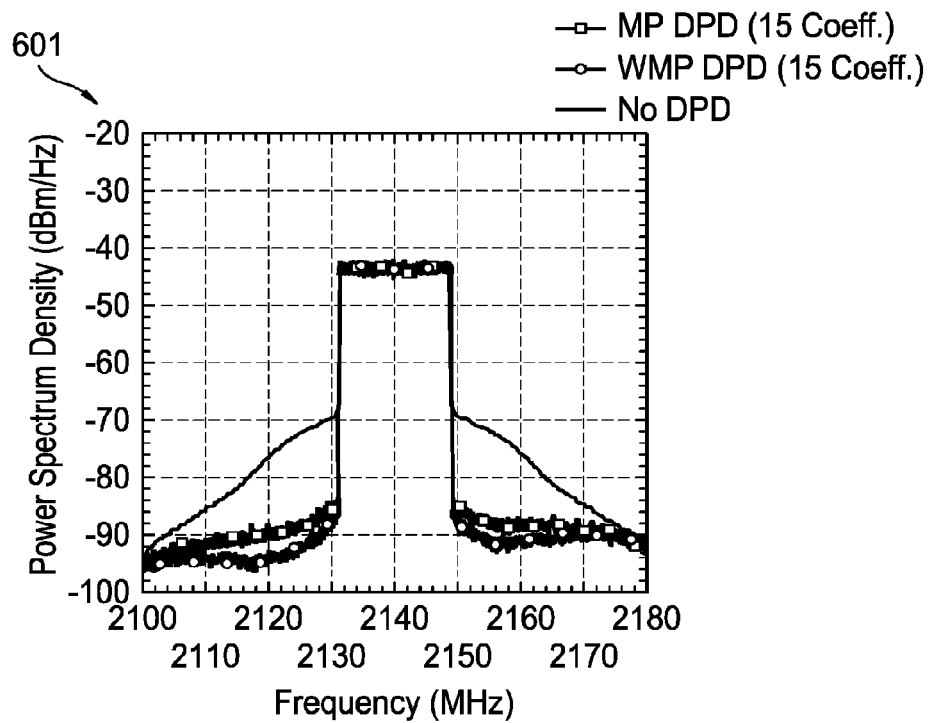
FIG. 6 shows exemplary digital predistortion performance of a weighted memory polynomial predistorter and a memory polynomial predistorter.
Figure 6B:
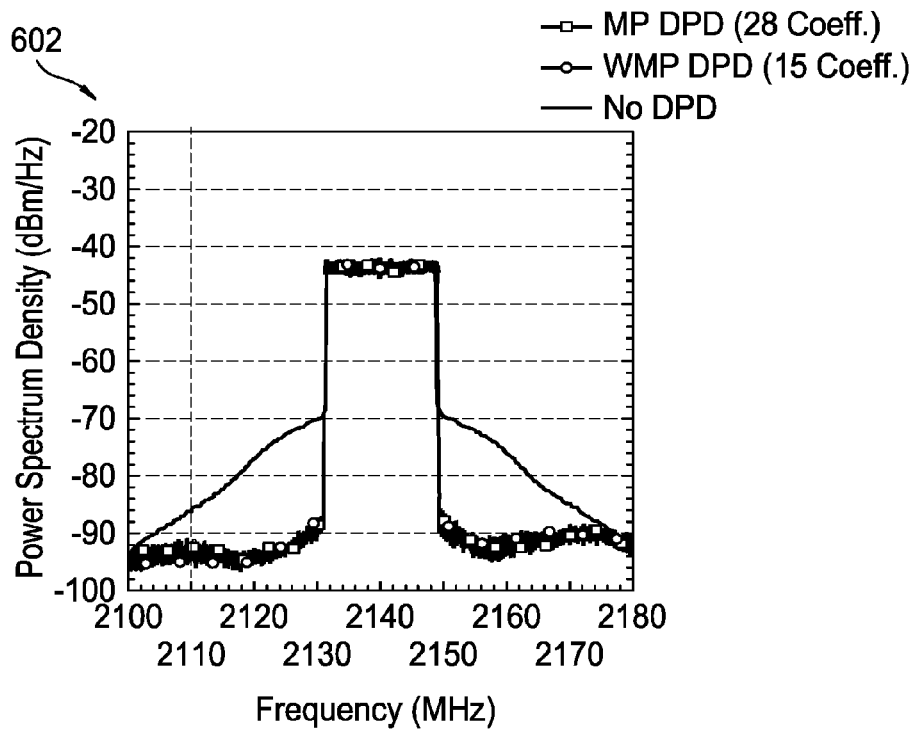

The predistorters were derived using only a subset of the measurement data (approximately 10% of the samples). The performances of the MP and WMP predistorters were evaluated by measuring the spectra of the signal at the output of the power amplifier before predistortion, after predistortion using the memory polynomial function, and after predistortion using the proposed weighted memory polynomial function. FIG. 6 reports a summary of the obtained results. 601 and 602 are plots of the spectra obtained at the output of the power amplifier before predistortion and after predistortion using memory polynomial and then the weighted memory polynomial functions. In plot 601, both predistorters had the same number of coefficients (15 each). Plot 601 demonstrates the superiority of the proposed predistortion function which leads to better spectrum regrowth cancellation for the same complexity as its MP counterpart. In plot 602, the number of coefficients in the memory polynomial predistorter was increased to minimum needed to ensure similar performance as what was obtained with the 15-coefficients based weighted memory polynomial predistorter. According to 602, the memory polynomial based predistorter requires 28 coefficients to achieve the performance obtained with only 15 coefficients in the case of the weighted memory polynomial predistorter. This experimental validation demonstrates the superiority of the proposed digital predistortion function which reduces by approximately 50% the number of coefficients required to achieve acceptable spectrum regrowth cancellation. This will have a direct impact on the complexity of the digital predistortion identification and update performed in 107.

A novel weighted memory polynomial based predistorter is disclosed for RF power amplifiers linearization. The predistorter model, method and system introduce a weight function on the coefficients of the conventional memory polynomial model. Experimental validation on an LTE Doherty power amplifier demonstrates the superiority of the disclosed model, method and system which can achieve the same performance as its conventional memory polynomial counterpart with up to 50% reduction in the number of coefficients.

The LTE signal was used as an example to illustrate the performance of the disclosed predistorter. The weighted memory polynomial based predistorter can be applied to linearize dynamic nonlinear power amplifiers and transmitters independently of the type and characteristics of their drive signal.

It is understood that the weighted memory polynomial model can also be used for behavioural modelling of dynamic nonlinear power amplifiers and transmitters with consistent advantages compared to the memory polynomial model.

Figure 7:
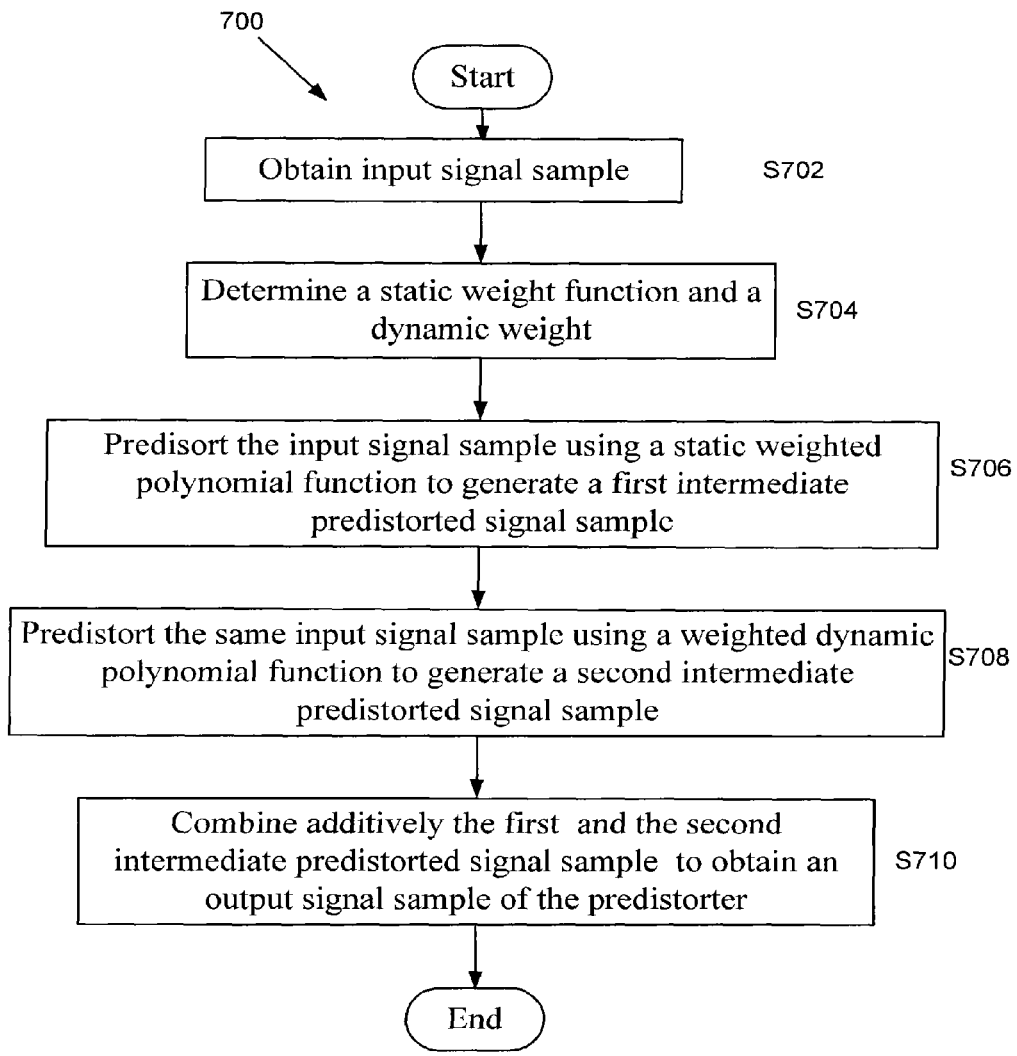
FIG. 7 illustrates predistorted signal calculation process in sequence, by way of flowchart.

Referring to FIG. 7 a flowchart 700 describing the proposed method in sequence for generating a predistorted signal according to the present invention is shown.

In step 702, processing circuitry obtains an input signal sample of an input signal to the power amplifier;

In step 704, the processing circuitry uses the input signal sample to determine a static weight function and a dynamic weight function;

In step 706, the processing circuitry predistorts the input signal sample using a static weighted polynomial function to generate a first intermediate predistorted signal sample;

In step 708, the processing circuitry predistorts the same input signal sample using a weighted dynamic polynomial function to generate a second intermediate predistorted signal sample; and In step 710, the processing circuitry combines additively the first intermediate predistorted signal sample and the second intermediate predistorted signal sample together to obtain an output signal sample of the predistorter.

Figure 8:
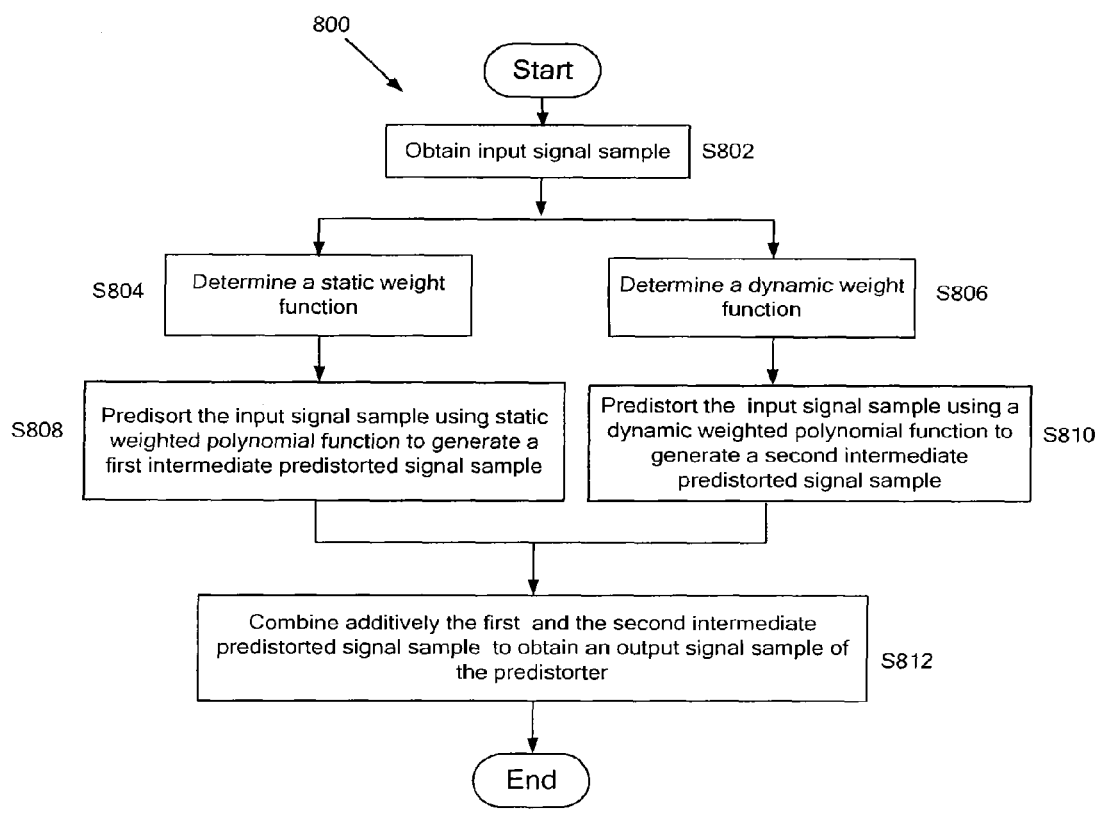
FIG. 8 illustrates predistorted signal calculation process, by way of flowchart.

Referring to FIG. 8 a flowchart 800 describing the proposed method for generating a predistorted signal according to the present invention is shown.

In step 802, processing circuitry obtains an input signal sample of an input signal to the power amplifier;

In step 804, the processing circuitry calculates a static weight function;

In step 806, the processing circuitry calculates a dynamic weight function;

In step 808, the processing circuitry predistorts the input signal sample using a static weighted polynomial function to generate a first intermediate predistorted signal sample;

In step 810, the processing circuitry predistorts the same input signal sample using a weighted dynamic polynomial function to generate a second intermediate predistorted signal sample; and In step 812, the processing circuitry combines additively the first intermediate predistorted signal sample and the second intermediate predistorted signal sample together to obtain an output signal sample of the predistorter.

Figure 9:
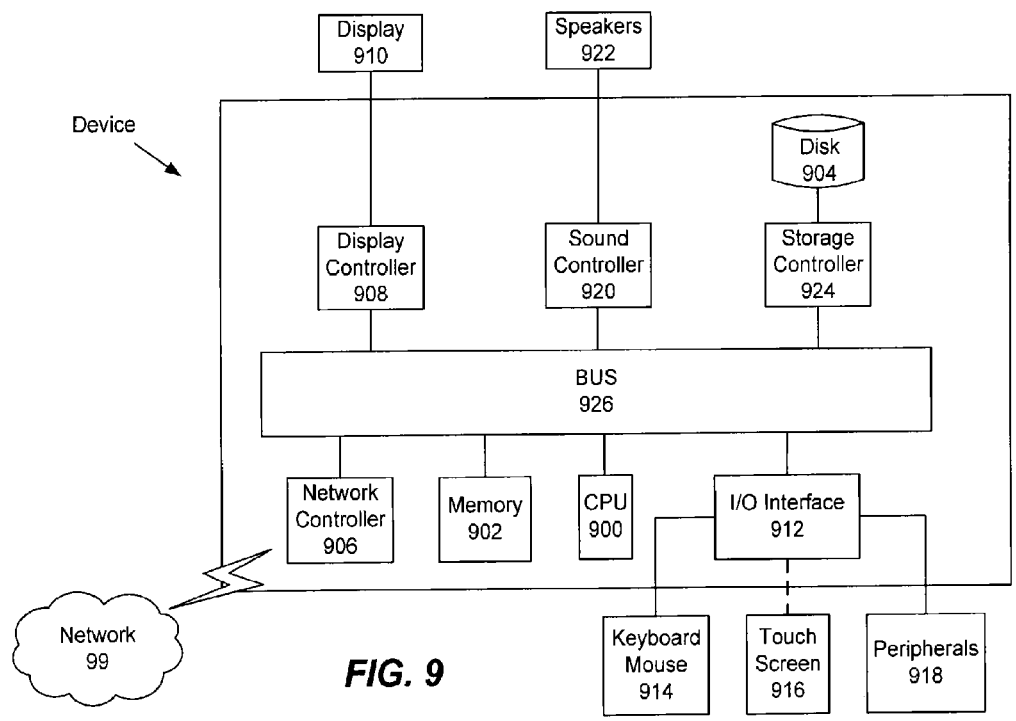
FIG. 9 shows a schematic diagram of an exemplary processing system.

Next, a hardware description of the device according to exemplary embodiments is described with reference to FIG. 9. In FIG. 9, the device includes a CPU 900 which performs the processes described above. The process data and instructions may be stored in memory 902. These processes and instructions may also be stored on a storage medium disk 904 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the device communicates, such as a server or computer.

Further, the claimed advancements may be provided as a utility application, background daemon, or component of an operating system, or combination thereof, executing in conjunction with CPU 900 and an operating system such as Microsoft Windows 7, UNIX, Solaris, LINUX, Apple MAC-OS and other systems known to those skilled in the art.

CPU 900 may be a Xenon or Core processor from Intel of America or an Opteron processor from AMD of America, or may be other processor types that would be recognized by one of ordinary skill in the art. Alternatively, the CPU 900 may be implemented on an FPGA, ASIC, PLD or using discrete logic circuits, as one of ordinary skill in the art would recognize. The predistortion can be implemented in the FPGA or the ASIC. Further, CPU 900 may be implemented as multiple processors cooperatively working in parallel to perform the instructions of the inventive processes described above.

The device in FIG. 9 also includes a network controller 906, such as an Intel Ethernet PRO network interface card from Intel Corporation of America, for interfacing with network 99. As can be appreciated, the network 99 can be a public network, such as the Internet, or a private network such as an LAN or WAN network, or any combination thereof and can also include PSTN or ISDN sub-networks. The network 99 can also be wired, such as an Ethernet network, or can be wireless such as a cellular network including EDGE, 3G and 4G wireless cellular systems. The wireless network can also be WiFi, Bluetooth, or any other wireless form of communication that is known.

The device further includes a display controller 908, such as a NVIDIA GeForce GTX or Quadro graphics adaptor from NVIDIA Corporation of America for interfacing with display 910, such as a Hewlett Packard HPL2445w LCD monitor. A general purpose I/O interface 912 interfaces with a keyboard and/or mouse 914 as well as a touch screen panel 916 on or separate from display 910. General purpose I/O interface also connects to a variety of peripherals 918 including printers and scanners, such as an OfficeJet or DeskJet from Hewlett Packard.

A sound controller 920 is also provided in the device, such as Sound Blaster X-Fi Titanium from Creative, to interface with speakers/microphone 922 hereby providing sounds and/or music.

The general purpose storage controller 924 connects the storage medium disk 904 with communication bus 926, which may be an ISA, EISA, VESA, PCI, or similar, for interconnecting all of the components of the device. A description of the general features and functionality of the display 910, keyboard and/or mouse 914, as well as the display controller 908, storage controller 924, network controller 906, sound controller 920, and general purpose I/O interface 912 is omitted herein for brevity as these features are known.

It is to be understood that the present invention is not limited to the embodiments described above, but encompasses any and all embodiments within the scope of the following claims.

The invention claimed is:

1. A method for linearizing a power amplifier having a memory effect with a system for linearizing a power amplifier through digital predistortion, comprising:

inputting an input signal sample, predistorting the input signal sample to generate a first and a second intermediate predistorted signal samples, combining the first and the second intermediate predistorted signal samples to obtain an output signal, wherein the inputting, predistorting and combining are performed on an amplifier containing processing circuitry configured to:

obtain the input signal sample that depends on an input signal to the power amplifier;

predisort the input signal sample using a static weight function to generate the first intermediate predistorted signal sample;

predistort the same input signal sample using a dynamic weight function to generate the second intermediate predistorted signal sample;

combine additively the first intermediate predistorted signal sample and the second intermediate predistorted signal sample together to obtain an output signal sample of the predistorter, wherein the processing circuitry is further configured to determine the output signal sample of the predistorter using:

$$y_{WMP}(n) = \sum_{i=0}^{N_S} \alpha_i w_S(|x(n)|, i) x(n) |x(n)|^i + \sum_{i=0}^{N_D} \sum_{j=1}^{M} \beta_{ij} w_D(|x(n)|, i, j) x(n-j) |x(n-j)|^i$$

wherein $y_{WMP}(n)$ and $x(n)$ are output and input baseband complex samples, respectively, $\alpha_i$ and $\beta_{ij}$ are coefficients of the static and dynamic functions of the weighted memory polynomial predistorter, respectively, M is the memory depth of the model, $N_S$ and $N_D$ are nonlinearity order of the static and dynamic parts of the predistorter, respectively, and $w_S(|x(n)|,i)$ and $w_D(|x(n)|,i,j)$ are the weight functions applied on the static and dynamic terms of the predistorter, respectively.

2. The method of claim 1, wherein the processing circuitry is further configured to determine the static weight polynomial function using:

$$w_S(|x(n)|, i) = \frac{1}{2}\left(\tanh\left(-F(i) \cdot \left(1 - \frac{|x(n)|}{|x|_{th}}\right)\right) + 1\right)$$

wherein tan h is the hyperbolic tangent function, $x(n)$ is the input baseband complex sample, $|x|_{th}$ is a device dependent threshold value used to separate between the region where the static nonlinearity predominates from that where the dynamic distortions predominate, and $F(i)$ is proportional to the nonlinearity order $(i)$.

3. The method of claim 2, wherein the function $F(i)$ is defined according to:

$$F(i)=i$$

wherein i is a nonlinearity order.

4. The method of claim 1, wherein the processing circuitry further configured to determine the dynamic weight function using:

$$w_D(|x(n)|, i, j) = \frac{1}{2}\left(\tanh\left(G(i, j) \cdot \left(1 - \frac{|x(n)|}{|x|_{th}}\right)\right) + 1\right)$$

wherein tan h is a hyperbolic tangent function, x(n) is the input baseband complex sample and $|x|_{th}$ is a device dependent threshold value used to separate between the region where the static nonlinearity predominates from that where the dynamic distortions predominate, G(i,j) takes into account the decaying memory effects intensity for further memory indices and the fact that memory effects are mainly linear.

5. The method of claim 4, wherein the function G (i, j) is defined according to:

$$G(i, j) = \frac{1}{j^2 \cdot i}$$

wherein i is a nonlinearity order, and j is a given memory depth.

6. The method of claim 1, wherein the threshold parameter $|x|_{th}$ splits the nonlinear transfer characteristics of the device under test into a region where the static nonlinearity predominates and a region where the dynamic distortions predominate.

* * * * *